United States Patent [19]
Peeters et al.

[11] Patent Number: 5,865,938
[45] Date of Patent: Feb. 2, 1999

[54] WAFER CHUCK FOR INDUCING AN ELECTRICAL BIAS ACROSS WAFER HETEROJUNCTIONS

[75] Inventors: Eric Peeters, Mountain View, Calif.; Joel A. Kubby, Rochester, N.Y.

[73] Assignee: Xerox Corporation, Stamford, Conn.

[21] Appl. No.: 670,042

[22] Filed: Jun. 25, 1996

[51] Int. Cl.$^6$ ................................ C23F 1/08; C23F 1/00
[52] U.S. Cl. .......................................................... 156/345
[58] Field of Search ..................... 156/345; 204/192.32; 216/67; 252/79.1; 438/718, 715

[56] References Cited

U.S. PATENT DOCUMENTS

| | | | |
|---|---|---|---|
| 4,680,085 | 7/1987 | Vijan et al. | 156/643 |
| 4,717,448 | 1/1988 | Cox et al. | 156/643 |
| 4,758,305 | 7/1988 | Bonifield et al. | 156/643 |
| 4,971,653 | 11/1990 | Powell et al. | 156/626 |
| 5,129,981 | 7/1992 | Wang et al. | 156/628 |
| 5,129,982 | 7/1992 | Wang et al. | 156/628 |
| 5,242,533 | 9/1993 | Trah et al. | 156/628 |
| 5,312,717 | 5/1994 | Sachdev et al. | 430/313 |
| 5,338,416 | 8/1994 | Mlcak et al. | 204/129.3 |
| 5,356,829 | 10/1994 | Willman | 437/74 |
| 5,455,419 | 10/1995 | Bayer et al. | 250/423 F |
| 5,460,684 | 10/1995 | Saeki et al. | 156/345 |
| 5,474,650 | 12/1995 | Kumihashi et al. | 156/643.1 |
| 5,498,312 | 3/1996 | Laermer et al. | 156/643.1 |
| 5,672,541 | 9/1997 | Booske et al. | 437/160 |

FOREIGN PATENT DOCUMENTS

| | | |
|---|---|---|
| 0 473 930 | 3/1992 | European Pat. Off. . |
| 0 692 814 A1 | 1/1996 | European Pat. Off. . |
| 04275422 | 1/1992 | Japan . |

OTHER PUBLICATIONS

J. K. Bhardwaj, H. Ashaf; "Advanced Silicon Etching Using Density Plasmas"; Proceedings Of SPIE—The International Society For Optical Engineering: Micromachining And Microfabrication Process Technology; vol. 2639; 23–24 Oct. 95; Austin, TX, USA; pp. 224–233.

European Search Report for the corresponding European Application No. 97304432.4 with abstract.

Innovations. Surface Technology Systems Limited, Issue 3, 1994.

Innovations. Surface Technology Systems Limited, Jul. 1995.

J. K. Bhardwaj et al. Advanced Silicon Etching Using High Density Plasmas. SPIE, vol. 2639, pp. 224–233, 1995.

D. Craven et al. Anisotropic High–Aspect Ratio Etching in a High–Density Plasma. SPIE Conf. on Micromachining and Microfabrication '95, Oct. 1995, pp. 1–11.

D. Craven et al. Etching Technology and Applications for "Through–the–Wafer" Silicon Etching. SPIE vol. 2639, pp. 259–263, 1995.

H. Jansen et al. A Survey on the Reactive Ion Etching of Silicon in Microtechnology. RIE of Si in Microtechnology, vol. 6, 1996, pp. 14–28.

*Primary Examiner*—Marian C. Knode
*Assistant Examiner*—Brenda G. Brumback
*Attorney, Agent, or Firm*—Robert A. Burtzlaff

[57] ABSTRACT

A dry etch apparatus for micromachining a substrate having a first and a second layer of dissimilar materials joined together at a heterojunction includes a chuck for holding the substrate. The chuck has a first electrical contact positionable to contact the first layer, and second electrical contact positionable to contact the second layer, with the first and second electrical contacts being electrically isolated from each other. A voltage source is connected to the first electrical contact of the chuck to apply a voltage potential across the heterojunction of the substrate. When a plasma containing chemically reactive ions is directed against the second layer, etching of non-masked regions continues unless it is substantially stopped at the voltage biased substrate heterojunction. The substrate can be cooled or periodically recoated with erodable protective material to limit sidewall damage to the substrate while still allowing downward etching into the substrate. This dry etch process is well suited for construction of dimensionally accurate microdevices and microelectromechanical systems.

11 Claims, 4 Drawing Sheets

WAFER CHUCK FOR INDUCING AN ELECTRICAL BIAS ACROSS WAFER HETEROJUNCTIONS

FIELD OF THE INVENTION

The present invention relates generally to methods for selectively etching semiconductor materials. More particularly, the present invention relates to use of a dry etch process for micromachining a substrate provided with an electrically biased stop junction for controlling etch depth.

BACKGROUND AND SUMMARY OF THE INVENTION

Microelectromechanical systems (MEMS) are microdevices widely used as advanced sensors, microfluidic controls, or micromachines. Advanced MEMS sensors can be found in automobiles, medical instrumentation, or process control applications, and provide accurate determinations of pressure, temperature, acceleration, gas concentration, and many other physical or chemical states. Microfluidic controls include microvalves for handling gases or liquids, flow gauges, and ink jet nozzles, while micromachines include microactuators, movable micromirror systems, tactile moving assemblies, and such devices as atomic force microscopy cantilevers. Commonly, microdevices are constructed from semiconductor material substrates such as crystalline silicon, widely available in the form of a semiconductor wafer used to produce integrated circuits.

Because of the commonality of material, fabrication of microdevices from a semiconductor wafer substrate can take advantage of the extensive experience in both surface and bulk etching techniques developed by the semiconductor processing industry for integrated circuit (IC) production. Surface etching, used in IC production for defining thin surface patterns in a semiconductor wafer, can be modified to allow for sacrificial undercut etching of thin layers of semiconductor materials to create movable elements. Bulk etching, typically used in IC production when deep trenches or vias must be formed in a wafer using anisotropic etch processes, can be used to precisely machine edges or trenches in microdevices. Both surface and bulk etching of wafers can proceed with "wet processing", using chemicals such as potassium hydroxide in solution to remove non-masked material from a wafer. For microdevice construction, it is even possible to employ anisotropic wet processing techniques that rely on differential crystallographic orientations of materials, or the use of electrochemical etch stops, to define microdevice components. Unfortunately, freedom in designing complex microdevices is greatly constrained when wet processing etch techniques used. Wet processing is severely limited by dependence on semiconductor crystal orientation and the materials and etchants used. Even worse, microdevices containing thin extending structures are often susceptible to damage as a result of hydrodynamic forces incurred during wet processing.

An alternative etch processing technique that allows much greater microdevice design freedom is commonly known as "dry etch processing". This processing technique avoids many of the problems associated with wet etch processing of microdevices, and is particularly suitable for anistropic etching of fine structures. Dry etch processing encompasses many gas or plasma phase etching techniques ranging from highly anisotropic sputtering processes that bombard a wafer with high energy atoms or ions to displace wafer atoms into vapor phase (e.g. ion beam milling), to somewhat isotropic low energy plasma techniques that direct a plasma stream containing chemically reactive ions against a wafer to induce formation of volatile reaction products. Intermediate between high energy sputtering techniques and low energy plasma techniques is a particularly useful dry etch process known as reactive ion etching.

Reactive ion etching involves directing an ion containing plasma stream against a semiconductor wafer for simultaneous sputtering and plasma etching. Reactive ion etching retains some of the advantages of anisotropy associated with sputtering, while still providing reactive plasma ions for formation of vapor phase reaction products in response to contacting the reactive plasma ions with the wafer. In practice, the rate of wafer material removal is greatly enhanced relative to either sputtering techniques or low energy plasma techniques taken alone. Reactive ion etching therefore has the potential to be a superior etching process for construction of microdevices, with relatively high anistropic etching rates being sustainable.

Unfortunately for builders of microdevices, even though dry etch techniques such as reactive ion etching allow for high speed anisotropic etching of a semiconductor wafer rate, the accuracy of dry etch techniques is still not sufficient for many microdevice applications. For example, when trenches of a certain depth are to be defined in a wafer, dry etching by a reactive ion etch or other suitable technique is allowed to proceed for some empirically determined duration. This technique, known as time etch stop, presumes that all trenches will be cut to the same depth across the wafer if all etching factors are maintained as constants. For example, if the plasma stream is unvarying across the wafer, the wafer material is homogeneous and of constant thickness, and reaction products are removed at identical rates, all trenches of identical size and shape across the wafer should be cut to the same depth. However, as will be appreciated, the foregoing factors are generally not constant. Variances in the plasma stream, irregularities in the wafer thickness (typically on the order of 300 nanometers across a wafer), differences in materials or positioning, and differences in reaction removal rate will all deleteriously affect the accuracy of etching. This is particularly true when trenches vary in shape or dimensions, with large trenches generally being cut much faster than small trenches, primarily due to the reduced rate of removal of vapor phase ion reaction products from the smaller trenches. Although various expedients such as real time monitoring of etch rates have been tried, in practice it is very difficult to maintain accuracy of etch depth to within less than 300 nanometers for even adjacent structures. Accuracy of etch depth and thickness control during micromachining of widely separated structures on a wafer, or microstructures on different wafers, is typically even worse.

Accordingly, since current microdevice fabrication techniques have significant limitations, what is needed is a process for designing and constructing microdevices that is not limited by crystallographic orientation of a material or material choice, is not substantially limited in thickness, has a high reproducibility, and is compatible with existing integrated circuit fabrication processes and equipment. The process should allow a microdevice to be constructed with etch depth accuracies to within about 100 nanometers. For highest microdevice production yields, this etch depth accuracy must be maintained across a wafer substrate, and even between wafers. Further, such micromachining accuracy should be maintained regardless of feature size, with depth of small single micrometer width trenches as accurately defined as large hundred micrometer width trenches.

The present invention addresses these requirements by defining a dry etch micromachining process. Use of the process requires a substrate having at least one heterojunction between dissimilar materials. The substrate can include semiconductors (e.g. silicon, germanium, or gallium arsenide), and the dissimilar materials can include various p- or n-doped semiconductors. A voltage bias is applied across the at least one heterojunction of the substrate, and an ion containing plasma is directed against the substrate to etch the substrate. Because of the applied voltage bias, etching is significantly slowed or substantially stopped when etch depth reaches the heterojunction.

In certain embodiments, the heterojunction in the substrate is formed by coextensive or patterned epitaxial growth of a n-type layer on a p-type semiconductor wafer, or alternatively, by epitaxial growth of a p-type layer on an n-type wafer. In another embodiment, a heterojunction can be formed by wafer bonding a p-type silicon wafer and a n-type silicon wafer to form a silicon substrate having a p-layer and a n-layer. The silicon substrate is positioned in a conventional dry etching device, with the n-layer facing a stream of negative chemically reactive ions such as fluorine ions in a fluorocarbon plasma. The reverse voltage bias maintained is less than about the breakdown voltage of p-n heterojunctions in silicon, typically about 50 to about 100 volts, although it may range as high as 300 volts for certain configurations. To increase anisotropic etching of the silicon wafer and reduce destruction of sidewalls, a coating cycle can be maintained throughout the etch process. An erodable protective material (e.g. a polymer coating) is periodically applied to the silicon substrate to limit sidewall damage to the n-layer while still allowing downward etching into the substrate. Alternatively, in certain embodiments it is possible to omit this coating cycle by provision of a suitably cooled (typically less than 20 degrees Celsius) substrate and proper selection of reactant species, with desired anisotropic etching rates being maintained.

Constructing microdevices in defined patterns is enabled by masking the silicon substrate with a protective patterned layer. This protective patterned layer (mask) defines a masked surface that generally will not be eroded away during processing, protecting the underlying substrate from etching. That portion of the substrate that is not masked with a protective patterned layer constitutes an etchable surface. In certain embodiments, pattern control can be extended by selective diffusion or implantation of dopants into a wafer to produce, for example, a patterned heterojunction p-layer that is not coextensive with an overlaying n-layer. When the heterojunction is not coextensive and continuous in a wafer, downward etching completely through the substrate is possible in those patterned regions lacking an underlying heterojunction.

In one preferred embodiment, the method of the present invention can be practiced by use of a novel chuck for holding a substrate in an otherwise conventional dry etch processing apparatus. The dry etch apparatus must be suitable for micromachining a substrate having a first and a second layer of dissimilar materials joined together at a heterojunction, and can be any of the many commercially available dry etching units. In this embodiment of the invention, the chuck holding the substrate has a first electrical contact positionable to contact the first layer, and second electrical contact positionable to contact the second layer. The first and second electrical contacts are maintained in electrical isolation from each other, and a voltage source is connected to the first electrical contact of the chuck to apply a voltage potential across the heterojunction of the substrate. As those skilled in the art will appreciate, although individual electrical contacts can be employed, typically multiple electrical contacts are used to more evenly distribute the voltage bias applied across the heterojunction of the substrate.

Additional functions, objects, advantages, and features of the present invention will become apparent from consideration of the following description and drawings of preferred embodiments.

DETAILED DESCRIPTION OF THE INVENTION

Figure 1:
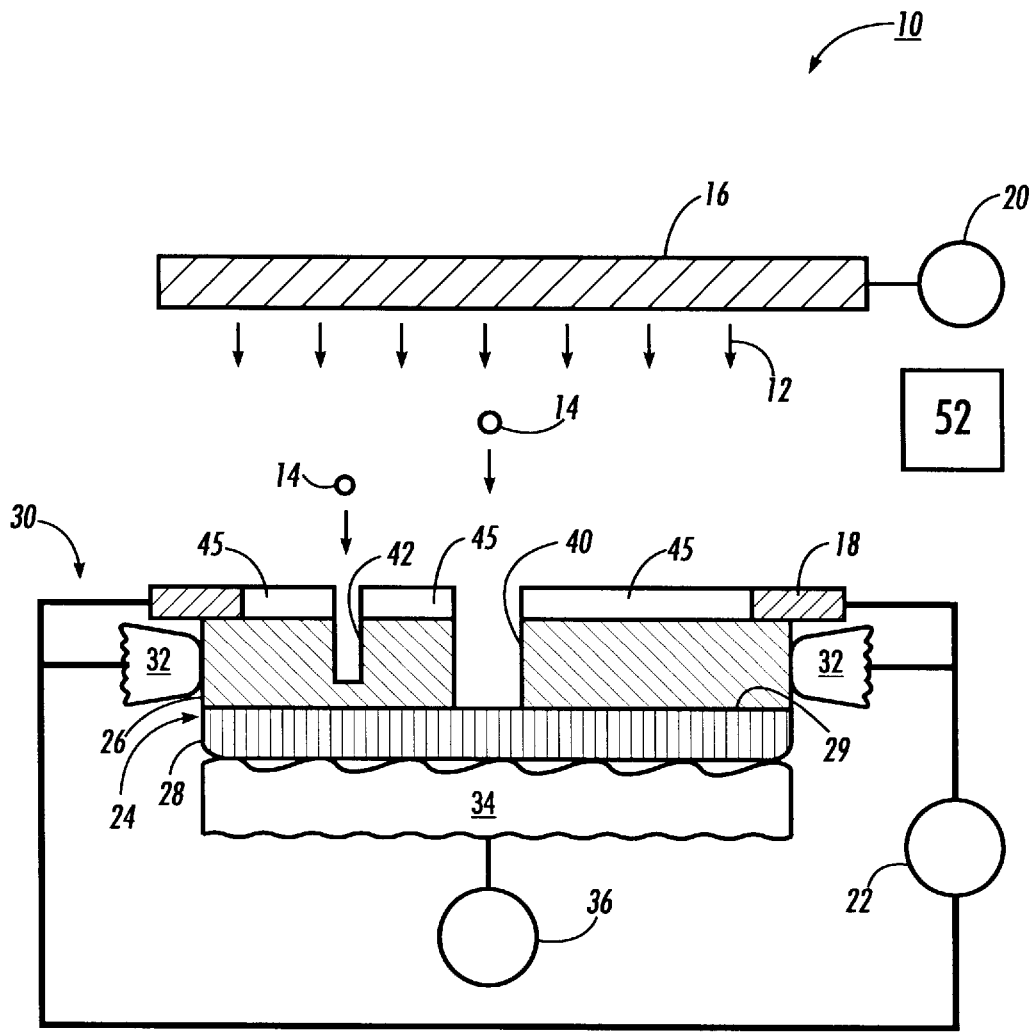
FIG. 1 is diagram generally illustrating a substrate and a substrate holding chuck useful for practicing the present invention, with the chuck having electrically isolated contacts to apply a bias voltage across a heterojunction in the substrate to provide an electrical etch stop.

FIG. 1 schematically illustrates a particular embodiment of a dry etch processing apparatus 10 suitable for practice of the present invention. Applying a voltage differential between electrode 16 and electrode 18 in a partially evacuated reaction chamber containing reactant gases induces a stream of plasma 12 containing ions 14. Ions 14 are conventionally negative ions such as fluorine (F⁻), but can be positive ions in certain embodiments. The electrode 16 is connected to a first voltage source 20 (usually a negative radiofrequency voltage source), while the electrode 18 is connected to a second voltage source 22 to create the voltage differential. As will be appreciated, when negative ions 14 are used, the second voltage source 22 must be maintained at a higher voltage or at ground to induce ion flow from electrode 16 (acting as a cathode) toward electrode 18 (acting as an anode). Of course, when positive ions 14 are used, this is reversed, with second voltage source 22 being maintained at a is lower voltage then first voltage source 20. Electrode 16 then acts as an anode, while electrode 18 acts as the cathode.

The combination of plasma 12 and ions 14 is directed against a substrate such as semiconductor wafer 24. The wafer 24 has at least two heterolayers, exemplified in FIG. 1 as n-layer 26 and a p-layer 28, having p-n heterojunction 29. The wafer 24 is securely held in position by a wafer chuck 30 which can optionally include or be connected to a separate cryogenic source. The wafer chuck 30 can also be provided with any other suitable cooling mechanism to allow cooling of the wafer 24 below room temperature, and preferably to between about 20 degrees and −140 degrees Celsius, to modify process conditions and encourage anisotropic reactions. In addition to physically retaining the wafer 24 and providing optional temperature control, the wafer chuck 30 allows the wafer 24 to electrically connect with a first electrical contact 32 and a second electrical contact 34. These contacts 32 and 34 can be physically integrated with chuck 30 to hold the wafer 24, as illustrated in FIG. 1, or alternatively, the chuck 30 can be designed to merely allow wafer access for contacts 32 and 34. The contacts 32 and 34 are electrically isolated from each other, with the first electrical contact 32 in electrical connection with the n-layer 26 and the second electrical contact 34 in electrical connection with the p-layer 28.

In the illustrated embodiment the first electrical contact is connected to the second voltage source 22, which can be maintained at ground or some other desired voltage. The second electrical contact 34 is connected to a third voltage source 36. The third voltage source 36 is respectively maintained at a lower voltage than second voltage source 22 if ions 14 are negative, and at a higher voltage than second voltage source 22 if ions 14 are positive. If a reverse biased p-n heterojunction 29 is to be maintained, the third voltage source 36 can be a DC electrical power source of less than 100 volts, with 25–50 volts being typical for operation.

As shown in FIG. 1, a wide trench 40 and a narrow trench 42 are defined by an etch mask 45 covering the wafer 24. A gas reagent unit 52 capable of releasing different gases to vary plasma composition, pressure, or distribution is generally indicated by a box adjacent to electrodes 16 and 18. As will be appreciated, release and monitoring of plasma creating gas reagents is critical to operation of dry etchers, and various gas release mechanisms are commercially available. The gas reagent unit 52 is also capable of periodically dispensing optional passivating agents such as polymeric materials that function as a protective coating during etch processing. As will be appreciated, varying plasma conditions and composition does not necessarily require change in reactant gases released by unit 52. In many embodiments of the invention plasma composition can be varied by adjusting electrical conditions or pressures, for example, to allow plasma mediated deposition of a protective coating polymer or passivating layer by increasing reaction chamber pressure or reducing the voltage differential between electrodes 16 and 18.

In operation, ions 14 contained in plasma 12 downwardly etch through portions of the substrate not protected by mask 45. Absent a bias voltage across heterojunction 29, ion etching would continue downward through the substrate, and eventually completely etch through the wafer. However, in the present invention downward etching substantially stops when the voltage biased heterojunction 29 is reached, assuming that the heterojunction is maintained at a bias voltage less than required for junction breakdown and the ions do not have energy levels substantially greater than the applied bias voltage. In the case of a p-n silicon wafer, the breakdown voltage is approximately 50 to 100 volts, with heterojunctions constructed of other materials of course have differing breakdown voltages known to those skilled in the art. Accordingly, for operation of the present invention the chuck 30 and its associated first electrical contact 32 and a second electrical contact 34 must apply a bias voltage less than the breakdown voltage for the heterojunction of the substrate, and the energy level of ions 14 must be generally also be maintained below that energy level.

Various commercially available dry etch processing machines capable of accommodating the foregoing conditions can be employed in the present invention. Suitable dry etch machines will generally have one or more etching chambers that can be evacuated to a desired pressure level by a vacuum pump system. In addition, a suitable dry etch machine will be capable of metering and controlling a range of reactant gases, and have suitable plasma sources, such as a voltage adjustable electrodes connected to a radiofrequency power supply to create a glow discharge plasma. Various optical, pressure, electrical, temperature, or flow rate sensors can be used to actively monitor conditions in the etching chamber. One particularly preferred dry etch process machine that can be modified for practice of the present invention is the Multiplex ICP, commercially supplied by Surface Technology System, Ltd. (STS), and operated in part according to an Advance Silicon Etching (ASE) procedure detailed in a paper titled "Advanced Silicon Etching Using High Density Plasmas", by J. K. Bhardwaj and H. Ashraf, 224 SPIE Vol. 2639, the disclosure of which is hereby expressly incorporated by reference. Another particularly preferred dry etch process machine that can be modified for practice of the present invention is the Alcatel Micromachining Etch Tool (A602E), commercially supplied by Alcatel Corp., and operated in part according to a procedure described in a paper titled "Etching Technology and Applications for "through-the-wafer" Silicon Etching", by Craven et al., SPIE, Vol. 2639, pp. 259–263., and in a conference proceeding entitled "Anisotropic High-Aspect Ratio Etching in a High-Density Plasma", by Craven et al., SPIE Conference on Micromachining and Microfabrication, October 1995, the disclosures of which are hereby expressly incorporated by reference. In the Alcatel process, an inductively coupled high density plasma ($10^{11}$–$10^{13}$ ions/cm$^2$) is generated downstream of a wafer substrate, and a $SF_6$ reactant species is used to flow across the wafer under reaction temperatures ranging from 20 to −140 degrees Celsius. The wafer is maintained at these low temperatures by a cryogenically cooled chuck, the temperature of which can be optimized as required for best reaction conditions to allow highly anistropic etching of the substrate. With suitable modifications, dry etch process machines supplied by other commercial manufacturers can also be used.

Operating factors capable of modification for practice of the present invention include reactant gases, ion species, pressures, temperatures, and ion energy ranges. The exact combination of operating factors will vary with time, and critically depends upon characteristics of the dry etch machine, the substrate, the required etching rate, the anisotropy needed, and other factors known to those skilled in the art. Chlorine, bromine, or fluorine based plasma reactants can be used, as well as more exotic reactant chemistries if required. For example, for silicon, amorphous silicon, and polysilicon substrates it is possible to use fluorocarbons such as carbon tetrafluoride $CF_4$, chlorocarbons such as carbon tetrachloride ($CCl_4$), combinations of $CF_4$ and diatomic oxygen ($O_2$), $CF_3Cl$, $SF_6$, $SF_6/Cl$, $Cl_2+H_2$, $C_2ClF_5/O_2$, $NF_3$, $BCl_3$ and many other reactant gases, alone or in combination. Reactant gas concentration, gas distribution, pressure level, energy level, and even substrate thermodynamics (e.g.

through cryogenic cooling of the substrate) can be adjusted to optimize etching. In certain embodiments, plasma reactants can even include passivating agents to reduce sidewall etching and enhance etching anisotropy.

Mechanisms for generating plasma from reactant gases for operation of the present invention are diverse, and can include those associated with conventional reactive ion etchers (RIE), magnetically enhanced RIE (MERIE), electron cyclotron resonance (ECR), inductively coupled plasma (ICP), barrel etch systems, downstream etchers, magnetron ion etchers (MIE), parallel or stacked parallel plate etchers, cylindrical batch etchers (hexode-type etchers), or any other suitable plasma based dry etch method capable of delivering ions of a selected species and within a desired energy range to a targeted substrate. As noted previously, one preferred embodiment of the present invention uses a Multiplex ICP (inductively couple plasma) dry etch unit, commercially supplied by Surface Technology System, Ltd. (STS), and operated according to an Advance Silicon Etching (ASE) procedure, while the other previously noted embodiment supplied by Alcatel also uses inductively coupled plasma to provide a high density plasma for anisotropic etching.

Composition and structure of substrates suitable for use in conjunction with the present invention are also diverse. Semiconductor wafers having heterojunctions formed with patterned diffusion layers, ion implanted sections, or epitaxial coatings can all be used. Semiconductor wafers can be wafer bonded together, and semiconductors wafers with multiple epitaxial layers of varying composition can be etched. Semiconductor materials suitable for forming voltage biasable heterojunctions can include pure or appropriately doped (usually by III–V dopants) materials such as silicon, polysilicon, amorphous silicon, germanium, gallium arsenide, germanium arsenide, GaP, CdSe, CdS, ZnS, AlAs, ZnTe, GaP, GaSb, InP, InSb, and numerous other conventional materials known to those skilled in the art.

Substrates can be held with various types of chucks. For operation of the present invention, a chuck must be able to securely hold a substrate having at least two layers to define a heterojunction. Spring, gripping, clamp, or other conventional holding mechanisms can be used. In addition to constraining movement of the substrate, a suitable chuck must still allow electrical contact with layers on each side of the heterojunction, and ensure that this electrical contact is not short circuited through the chuck. In certain embodiments, a chuck can consist of two or more distinct components, with the components of the chuck being unconnected or connected to each other only through insulated intermediate components to ensure electrical isolation. As will be appreciated by those skilled in the art, various commercially available chucks (including cryogenically cooled chucks such as used on the Alcatel A620E dry etcher) can be modified to allow the required electrical contact, or custom designed chucks with the required electrical characteristics can be used.

Figure 2:
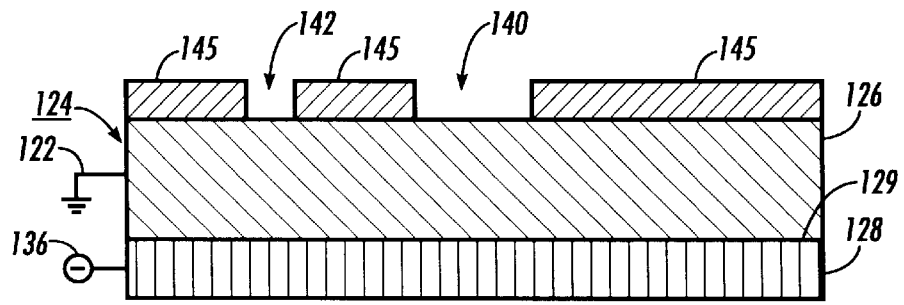
FIG. 2 schematically illustrates a two layer substrate having a heterojunction and a mask layer.

Operation of the present invention in one particular embodiment is schematically illustrated in FIGS. 2 through 6. FIG. 2 schematically illustrates a two layer substrate 124 having a p-n heterojunction 129 between n-layer 126 and p-layer 128. The p-layer 128 is connected to a negative voltage source 136 and the n-layer is grounded, providing a reverse bias voltage across p-n heterojunction 129. The voltage source 136 maintains a voltage level insufficient to cause breakdown of the p-n heterojunction 129. The substrate 124 has a convention positive resist mask layer 145 to resist etching, with a wide trench gap 140 and a narrow trench gap 142 being defined.

In operation, an ion containing plasma is directed against the substrate 124 of FIG. 2, beginning downward etch through trench gaps 140 and 142. As can be seen from FIG. 3, downward etching through the wide gap 140 generally proceeds faster than downward etching through the narrow trench gap 142, primarily because of the difficulty associated with removal of ion reaction products from the narrow trench gap 142. After a limited time, the downward etch is temporarily stopped, and a protective layer 150 of erodable material such as polymers is laid down over the substrate 124 and mask 145.

Figure 3:
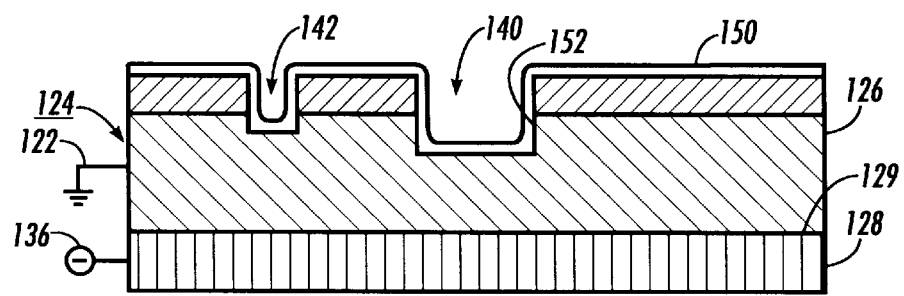
FIG. 3 schematically illustrates the two layer substrate of FIG. 2, after a limited etching of a wide and a narrow trench and application of a coating of erodable material over the substrate.
Figure 4:
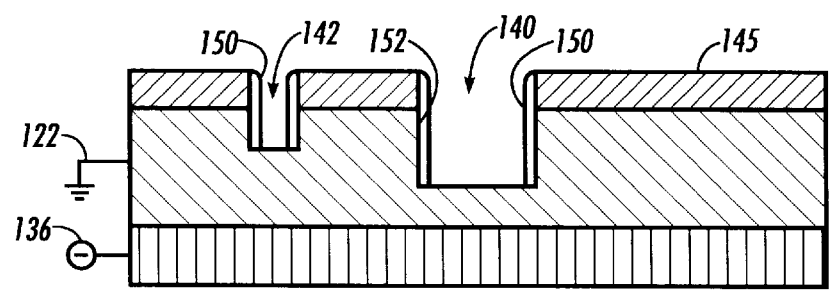
FIG. 4 schematically illustrates the two layer substrate of FIG. 3, with the substrate being etched downward in both the wide and the narrow trench while the sidewalls are still protected from etching by the coating of erodable material.

FIG. 4 schematically illustrates the two layer substrate of FIG. 3, with the substrate still being etched downward in both the wide and the narrow trench gaps 140 and 142 while sidewalls 152 are still protected from etching by the protective layer 150 of erodable material. As seen with reference to FIG. 4, downward etching to define a trench can continue for some time without substantially etching the sidewalls 152, providing a highly anistropic etch. Before the sidewall protective layer 150 completely erodes away, the etching is stopped, and the etch process is cycled to renew the protective layer 150 as seen in FIG. 3. When etch depths are measured in the hundreds of microns, this etch/recoat cycle is typically repeated hundreds of times. A particularly preferred process for the present invention is the previously discussed STS ASE trench process.

Figure 5:
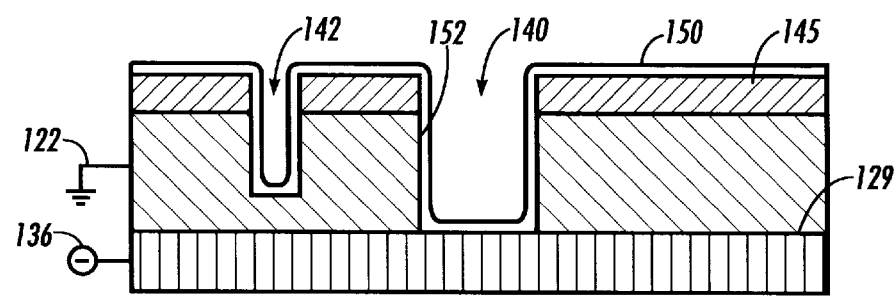
FIG. 5 schematically illustrates the two layer substrate of FIG. 4, with the substrate protected from etching in the wide trench by the applied voltage bias, while the narrow trench downward etching in the narrow trench proceeds.
Figure 6:
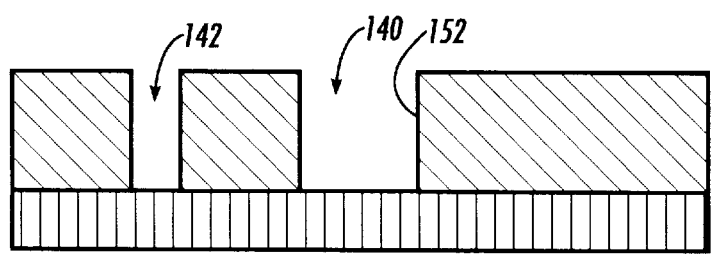
FIG. 6 schematically illustrates the two layer substrate of FIG. 5, with downward etching completed in both the wide and the narrow trench to about the same dimensional accuracy despite the differing etch rates and differing local substrate thickness.

As seen in FIG. 5, a major advantage of the present invention is the ability to continue the etch process in the slower etching narrow gap 142 even after downward etching has substantially stopped in the wide trench gap because of the applied reverse bias across heterojunction 129. As seen in FIG. 6, the etch process can continue until downward etching is completed in both the wide and the narrow trench to about the same dimensional accuracy. Advantageously, the trench depth for both the wide and narrow gaps 140 and 142 can be substantially identical despite the differing etch rates and even possible differing local substrate thickness.

Figures 7A, 7B:
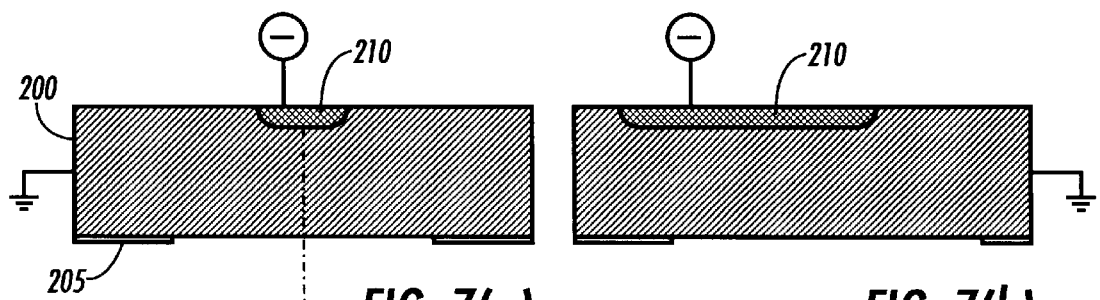
FIGS. 7–10 illustrate construction of a microdevice cantilever structure, with p-doped regions remaining after selectively etching a n-layer.
Figures 8A, 8B:
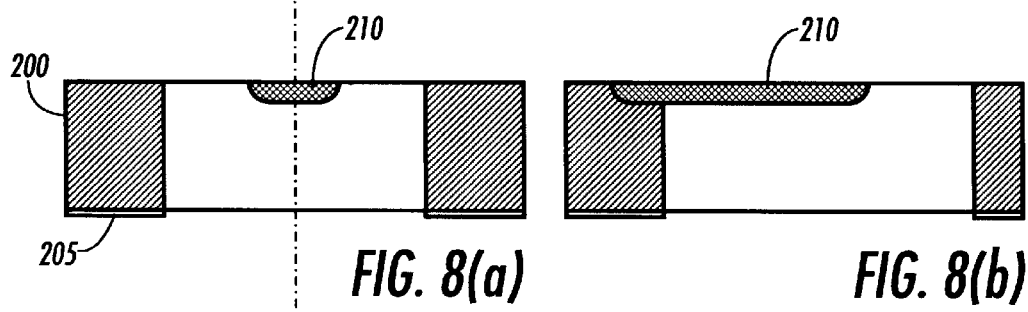
Figures 9A, 9B:
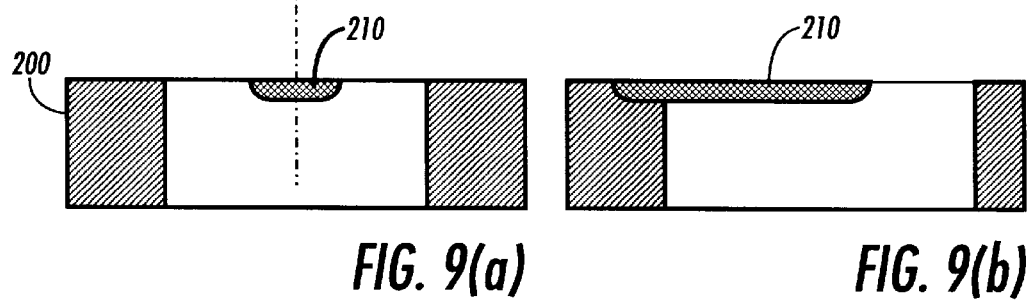
Figure 10:
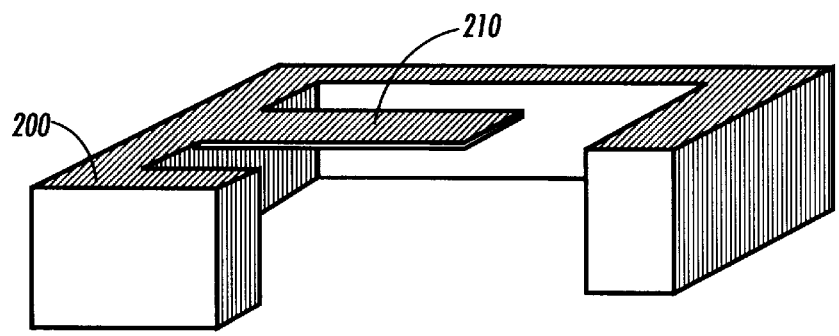

FIGS. 7–10 briefly illustrate construction of another example of a microdevice cantilever structure capable of being constructed in accordance with the present invention. In FIG. 7 a n-type silicon substrate 200 partially masked by resist 205 and having p-doped region 210 is shown in two perpendicular cross sections. P-doping can be through diffusion, implantation, or any other suitable technique. A reverse voltage bias is applied to the p-n heterojunction formed, and unmasked n-type silicon 200 is dry etched away as seen in FIG. 8, with the voltage bias stopping etching of the p-doped region 210. After etching away the mask 205 as seen in FIG. 9, a complex cantilever structure remains as seen in partial perspective view in FIG. 10.

Figure 11:
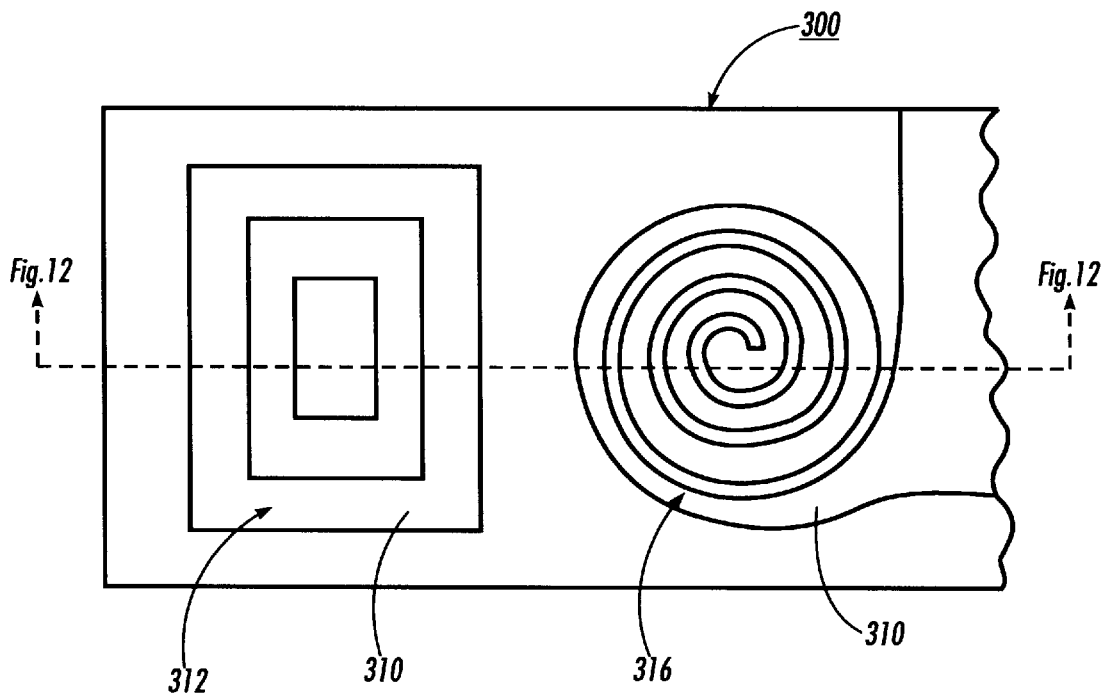
FIGS. 11–12 are respectively a schematic illustration in top view and cross section of an underside of a non-coextensive patterned p-layer (greatly magnified for clarity), with regions of n-layer that can be completely eroded away during the dry etch process.
Figure 12:
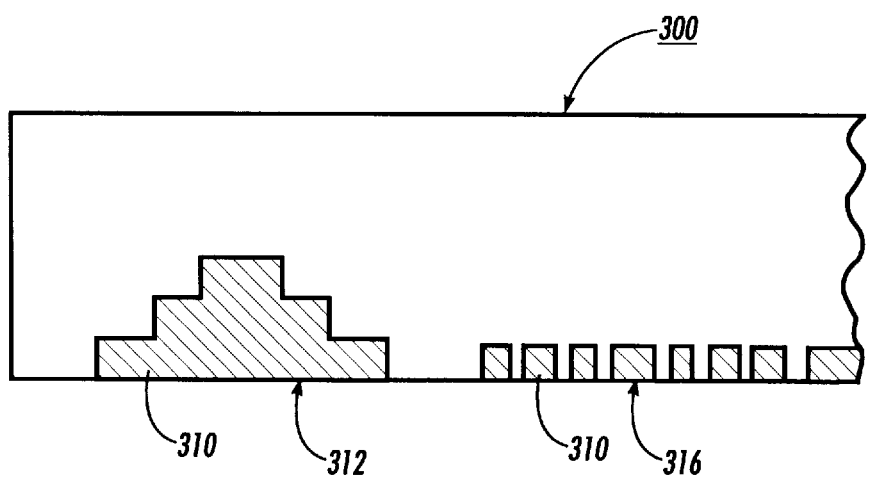

FIGS. 11 and 12 are general illustrations in top and cross sectional view showing other possible microdevice construction techniques using the present invention. A n-type silicon substrate 300 having a plurality of p-doped regions 310 is shown. Doping can be through diffusion, implantation, or any other suitable technique. As those skilled in the art will appreciate, after etching away the n-layer according to techniques of the present invention, a complex stepped structure 312 or a coil structure 316 can be respectively formed from the p-doped regions in a single step etch process.

Various alternatives, modifications, and adjustments to the foregoing described embodiments are possible, including techniques disclosed in a paper entitled, "A Survey on the Reactive Ion Etching of Silicon in Microtechnology" by Jansen et al., J. Micromech. Microeng. Vol. 6, 1996, pp.

14–28, the disclosure of which is hereby expressly incorporated by reference. As those skilled in the art will appreciate, other various modifications, extensions, and changes to the foregoing disclosed embodiments of the present invention are also contemplated to be within the scope and spirit of the invention as defined in the following claims.

The claimed invention is:

1. A dry etch apparatus for micromachining a substrate having a first and a second layer of dissimilar materials joined together at a heterojunction, the apparatus comprising a chuck for holding the substrate, the chuck having a first electrical contact positionable to contact the first layer, and a second electrical contact positionable to contact the second layer, with the first and second electrical contacts being electrically isolated from each other, and a voltage source connected to the first electrical contact of the chuck to apply a voltage potential across the heterojunction of the substrate.

2. The dry etch apparatus of claim 1, wherein the second electrical contact is grounded.

3. The dry etch apparatus of claim 1, wherein the voltage source supplies less than about 100 volts to the first electrical contact.

4. The dry etch apparatus of claim 1, wherein the first electrical contact further comprises a plurality of first electrical contacts, and the second electrical contact comprises a plurality of second electrical contacts.

5. The dry etch apparatus of claim 1, wherein the first layer contacting the first electrical contact is a semiconductive n-layer and the second layer contacting the second electrical contact is a semiconductive p-layer.

6. The dry etch apparatus of claim 1, further comprising a first and a second plasma generating electrode, with the first plasma generating electrode connected to a radiofrequency power supply, the combination of first and second electrodes being arranged to direct an ion containing plasma against the substrate.

7. The dry etch apparatus of claim 1, further comprising a coating unit for coating the substrate with erodable protective material to limit sidewall damage to the substrate while allowing downward etching into the substrate.

8. The dry etch apparatus of claim 1, further comprising a cooling unit for cooling the substrate to less than about 20 degrees Celsius to limit sidewall damage to the substrate while allowing downward etching into the substrate.

9. A dry etch apparatus for micromachining a substrate having a first and a second layer of dissimilar materials joined together at a heterojunction, the apparatus comprising a first electrical contact positionable to contact the first layer, and a second electrical contact positionable to contact the second layer, with the first and second electrical contacts being electrically isolated from each other, and a voltage source connected to the first electrical contact to apply a voltage potential across the heterojunction of the substrate.

10. The dry etch apparatus of claim 9, further comprising a chuck for holding the substrate, with the first and second electrical contacts integrally defined in the chuck to respectively contact the first and second layers of the substrate.

11. The dry etch apparatus of claim 9, wherein the voltage source supplies less than about 100 volts to the first electrical contact.

* * * * *